United States Patent [19]

Hagino

[11] Patent Number: 5,767,730
[45] Date of Patent: Jun. 16, 1998

[54] INPUT SWITCH CIRCUIT FOR SWITCHING TWO VIDEO SIGNALS

[75] Inventor: Hideyuki Hagino, Kumagaya, Japan

[73] Assignee: Kabushiki Kaisha Toshiba, Kawasaki, Japan

[21] Appl. No.: 778,738

[22] Filed: Jan. 2, 1997

[30] Foreign Application Priority Data

Jan. 9, 1996 [JP] Japan .................................. 8-001629

[51] Int. Cl.$^6$ .................................................. H03K 17/56
[52] U.S. Cl. ............................ 327/407; 327/408; 327/411
[58] Field of Search .............................. 327/99, 108, 407, 327/408, 411

[56] References Cited

U.S. PATENT DOCUMENTS 4,978,924 12/1990 Schuster .................................. 330/254
5,055,705 10/1991 Hall ..................................... 307/296.4

FOREIGN PATENT DOCUMENTS 358062936 4/1983 Japan .................................. 327/411

Primary Examiner—Timothy P. Callahan
Assistant Examiner—An T. Luu
Attorney, Agent, or Firm—Oblon, Spivak, McClelland, Maier & Neustadt, P.C.

[57] ABSTRACT

The collector of the first transistor having the base to which the first signal input is supplied, is connected to the collector of the second transistor having the base to which the second signal input is supplied. The diode-connected third transistor is connected between the emitter of the first transistor and the output node, and the diode-connected fourth transistor is connected between the emitter of the second transistor and the output node. The first current mirror circuit supplies the current flowing in the constant current source to the emitters of the first and third transistors when the fifth transistor is in the ON state. The second current mirror circuit supplies the current flowing in the constant current source to the emitters of the second and fourth transistors when the sixth transistor is in the ON state. The third current mirror circuit sets the current flowing in the output node equal to the current flowing between the first power node and the collectors of the first and second transistors.

18 Claims, 2 Drawing Sheets

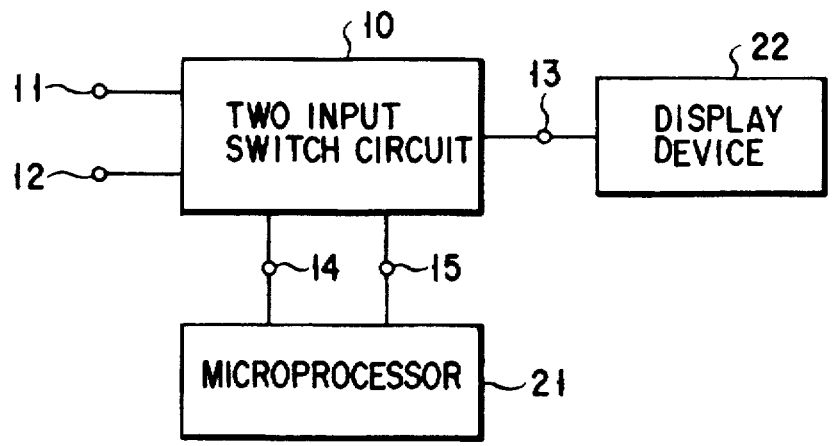
F I G. 1
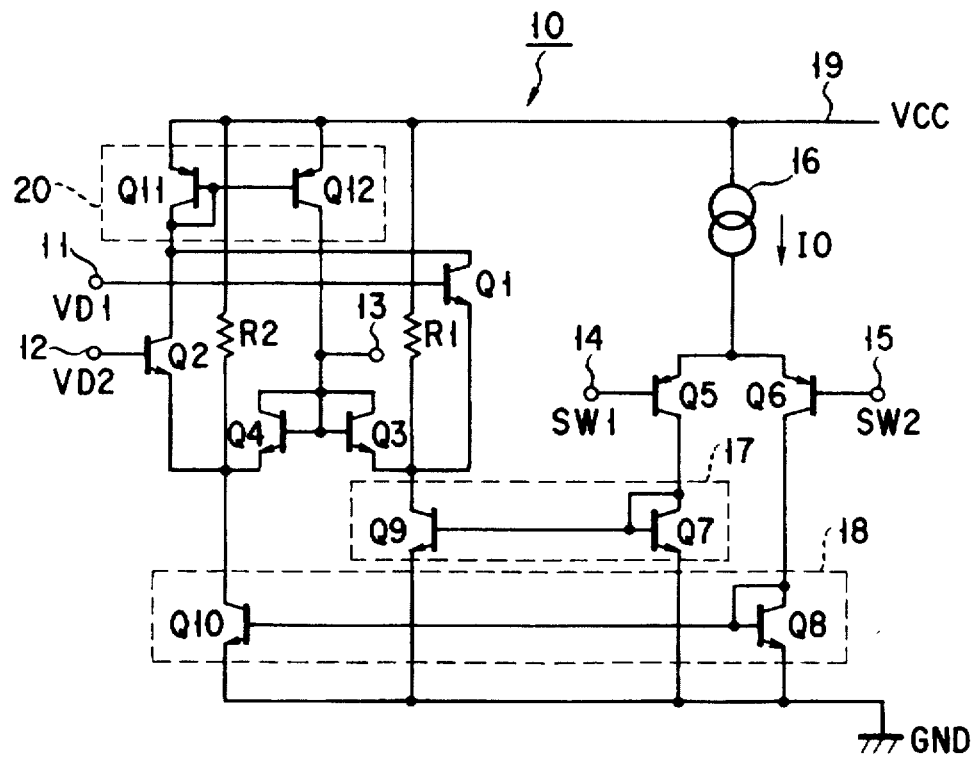
F I G. 2

5,767,730

INPUT SWITCH CIRCUIT FOR SWITCHING TWO VIDEO SIGNALS

BACKGROUND OF THE INVENTION

The present invention relates to an input switching circuit for switching a plurality of video signals, which is used in a display device for displaying, for example, a television image.

A display device for displaying, for example, a television image, has a function that character data such as channel number and time can be superimposed on a video signal now displaying. In order to superimpose character data on a picture being displayed, an image which is displayed in the middle of a horizontal scanning period of a video signal being displayed, and character data are switched.

FIG. 4 shows a conventional input switching circuit. In FIG. 4, reference numeral 11 denotes a first signal input node, and reference numeral 12 denotes a second signal input node. A first transistor Q1 of an NPN type functions as an input buffer. A base of the first transistor Q1 is connected to the first signal input node 11, and a collector of the transistor Q1 is connected to a power source node 19 to which a power potential (VCC) is supplied. A second transistor Q2 of the NPN type functions as an input buffer. A base of the second transistor Q2 is connected to the second signal input node 12, and a collector of the transistor Q2 is connected to the power source node 19.

An emitter of a third transistor Q3 of the NPN type is connected to an emitter of the first transistor Q1, and a base and a collector of this transistor (Q3) are connected to each other (diode connection), and are further connected to an output node 13. An emitter of a fourth transistor Q4 of the NPN type is connected to an emitter of the second transistor Q2, and a base and a collector of this transistor (Q4) are connected to each other (diode connection), and are further connected to the output node 13.

A first resistance element R1 is connected between the common emitter of the first and third transistors Q1 and Q3 and the power node 19, and a second resistance element R2 is connected between the common emitter of the second and fourth transistors Q2 and Q4 and the power node 19. A third resistance element R3 is connected between the base-collector commonly connected to the third and fourth transistors Q3 and Q4 and the power node 19.

Emitters of PNP-type fifth and sixth transistors Q5 and Q6 which constitute a differential amplifier are connected commonly to each other. Between the common emitter and the power node, a constant current source 16 is connected. Bases of the transistors Q5 and Q6 are connected to a first switch control signal input node 14 and a second switch control signal input node 15, respectively.

A collector-emitter of an NPN-type seventh transistor Q7 is connected between the collector of the fifth transistor Q5 and the ground (GND). The collector-emitter of an NPN-type eighth transistor QB is connected between the collector of the sixth transistor Q6 and the ground.

A base of an NPN-type ninth transistor Q9 is connected to the base and emitter of the seventh transistor Q7, and a collector of the ninth transistor Q9 is connected to the emitters of the first and third transistors Q1 and Q3. An emitter of the ninth transistor Q9 is grounded. The seventh transistor Q7 and the ninth transistor Q9 constitute a first current mirror circuit 17.

A base of an NPN-type tenth transistor Q10 is connected to the base and emitter of the eighth transistor Q8, and a collector of the tenth transistor Q10 is connected to the emitters of the second and fourth transistors Q2 and Q4. An emitter of the tenth transistor Q10 is grounded. The eighth transistor Q8 and the tenth transistor Q10 constitute a second current mirror circuit 18.

In the above-described structure, the case where a potential of the first switch control signal, applied to the first switch control signal input node 14 is lower than a potential of the second switch control signal, applied to the second switch control signal input node 15, is called a first selection mode, and the reverse case where the potential of the second switch control signal is lower than the potential of the first switch control signal, is called a second selection mode.

First, the operation of the first selection mode will now be described. In this operation, the fifth transistor Q5 is turned on, and the sixth transistor Q6 is turned off. Therefore, each of the seventh transistor Q1 and the ninth transistor Q9 of the first current mirror circuit 17 is turned on, and each of the first transistor Q1 and the third transistor Q3 is turned on. In this manner, the first input signal supplied to the base of the first transistor Q1 is output from the base-collector of the third transistor Q3, that is, the output node 13.

At this point, each of the eighth transistor Q8 and the tenth transistor Q10 which constitute the second current mirror circuit 18 is turned off, the potential of the emitter commonly connected to the second transistor Q2 and the fourth transistor Q4 is pulled up to the power potential VCC via the second resistance element R2. Therefore, both of the second transistor Q2 and the fourth transistor Q4 are turned off.

Next, the operation of the second selection mode will now be described. In this operation, the sixth transistor Q6 is turned on, and the fifth transistor Q5 is turned off. Therefore, each of the eighth transistor Q8 and the tenth transistor Q10 which constitute the second current mirror circuit 18, is turned on, and each of the second transistor Q2 and the fourth transistor Q4 is turned on. In this manner, the second input signal supplied to the base of the second transistor Q2 is output from the base-collector of the fourth transistor Q4, that is, the output node 13.

At this point, each of the seventh transistor Q7 and the ninth transistor Q9 which constitute the first current mirror circuit 17 is turned off, the potential of the emitter commonly connected to the first transistor Q1 and the third transistor Q3 is pulled up to the power potential VCC via the first resistance element R1. Therefore, both of the first transistor Q1 and the third transistor Q3 are turned off.

With the circuit having the above-described structure, in the first and second operation modes, a constant current IO from the constant current source 16 flows to one of the two current mirror circuits 17 and 18, and one of the third transistor Q3 and the fourth transistor Q4, connected to the output node 13, is in an ON state. Further, the output node 13 is connected to the power node via the third resistance element R3. Therefore, in the second selection mode, for example, when both of the transistors Q2 and Q4 are in the ON state, and both of the transistors Q1 and Q3 are in the OFF state, the emitter current of the transistor Q4, which can be represented by IEQ4, can be expressed by the following equation (1):

$$IEQ4 = (VCC - Vout)/R3 \qquad (1)$$

As is clear from the equation (1), the emitter current IEQ4 is dependent on the output signal voltage Vout.

On the other hand, when the emitter current of the transistor Q2 is expressed by IEQ2, a constant current IO flowing to the constant current source 16 can be expressed by the following equation (2):

$$IO=IEQ2+IEQ4+\{VCC-Vout-VT\ ln\ (IEQ4/Is)\}/R2 \qquad (2)$$

wherein $VT=kT/Q$, k represents Boltzmann's constant, T represents an absolute temperature, Q represents the charge of an electron and Is represents a reverse saturation current.

As can be understood from the above equation, both IEQ2 and IEQ4 vary while depending on the output signal voltage Vout, and IEQ2 and IEQ4 differ from each other. Therefore, it becomes difficult to cancel out a base-emitter voltage VFQ2 of the transistor Q2 with a base-emitter voltage VFQ4 of the transistor Q4. The base-emitter voltage VFQ2 of the transistor Q2 is expressed by the equation (3):

$$VFQ2=VT\ ln\{IO-(VCC-Vout)/R3-\{VCC-Vout-VT\ ln((VCC-Vout)/(Is.R3))\}/R2\}/Is \qquad (3)$$

The base-emitter voltage VFQ4 of the transistor Q4 is expressed by the equation (4):

$$VFQ4=VT\ ln\ (VCC-Vout)/(Is.R3) \qquad (4)$$

As shown above, the voltage VFQ2 and the voltage VFQ4 differs from each other, and therefore they cannot be made to cancel with each other.

Further, where Vin represents an input signal voltage, the output signal voltage Vout is expressed by the equation (5):

$$Vout=Vin-VFQ2+VFQ4 \qquad (5)$$

The output signal voltage Vout is influenced by the voltage VFQ2 and the voltage VFQ4, and becomes equal to the input signal voltage Vin.

In the conventional input switch circuit described above, the output signal voltage Vout output from the output node 13 is influenced by the voltage VFQ2 and the voltage VFQ4. As a result, in the switching operation for the two input signals, the linearity of an input output signal is deteriorated, and the DC level of the signal voltage Vout output from the output node 13 varies. Therefore, in the case where two video signals are switched over, noise is created at a boundary section of the two video signals, thus causing the deterioration in the image quality.

BRIEF SUMMARY OF THE INVENTION

The object of the present invention is to provide an input switch circuit capable of preventing the variation of the DC level when a plurality of input signals are switched over, and thus improving the linearity of the input/output signals, thereby making it possible to obtain a high-quality image.

The object of the invention can be achieved by the following structure, that is, an input switch circuit comprising:

a first transistor of a first polarity type, having a base to which a first input signal is supplied;

a second transistor of a first polarity type, having a base to which a second input signal is supplied, and a collector connected to a collector of the first transistor;

a third transistor of a first polarity type, having an emitter connected to an emitter of the first transistor, and a base and a collector both connected to an output node;

a fourth transistor of a first polarity type, having an emitter connected to an emitter of the second transistor, and a base and a collector both connected to the output node;

a first resistance element connected between a common emitter connected to the first and third transistors, and a first power node;

a second resistance element connected between a common emitter connected to the second and fourth transistors, and the first power node;

a first constant current source transistor connected between the common emitter connected to the first and third transistors, and a second power node;

a second constant current source transistor connected between the common emitter connected to the second and fourth transistors, and the second power node, one of the first and second constant current source transistors being turned on in accordance with first and second switch control signal; and a current circuit for setting a current flowing between the first power node and the output node, equal to a current flowing between the collectors of the first and second transistors and the first power node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a brief structure of the present invention;

FIG. 2 is a circuit diagram showing an embodiment of the input switch circuit shown in FIG. 1;

DETAILED DESCRIPTION OF THE INVENTION

Figure 3:
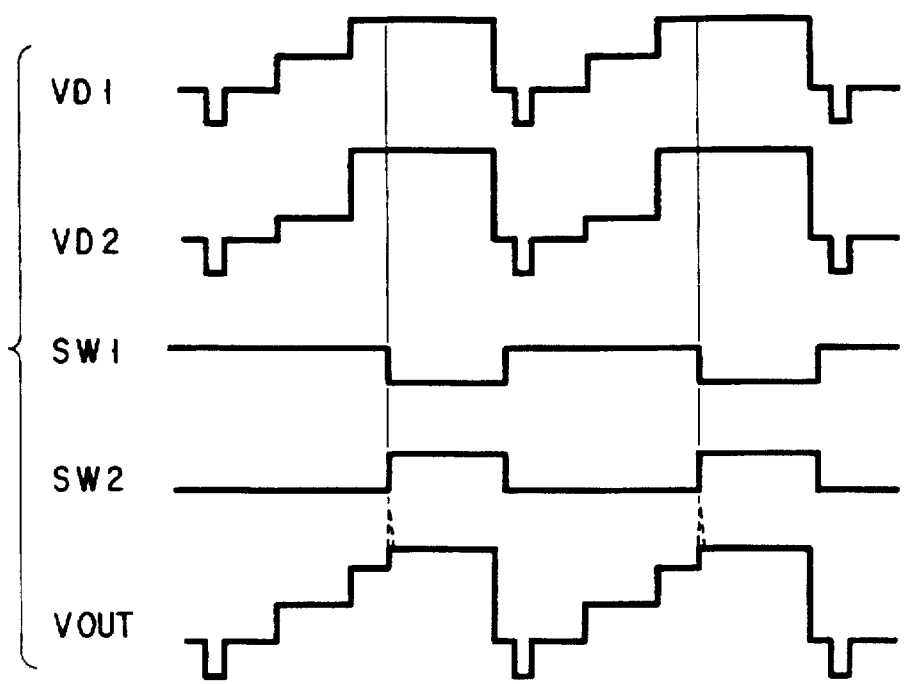
FIG. 3 is a timing chart illustrating an operation of the circuit shown in FIG. 2.
Figure 4:
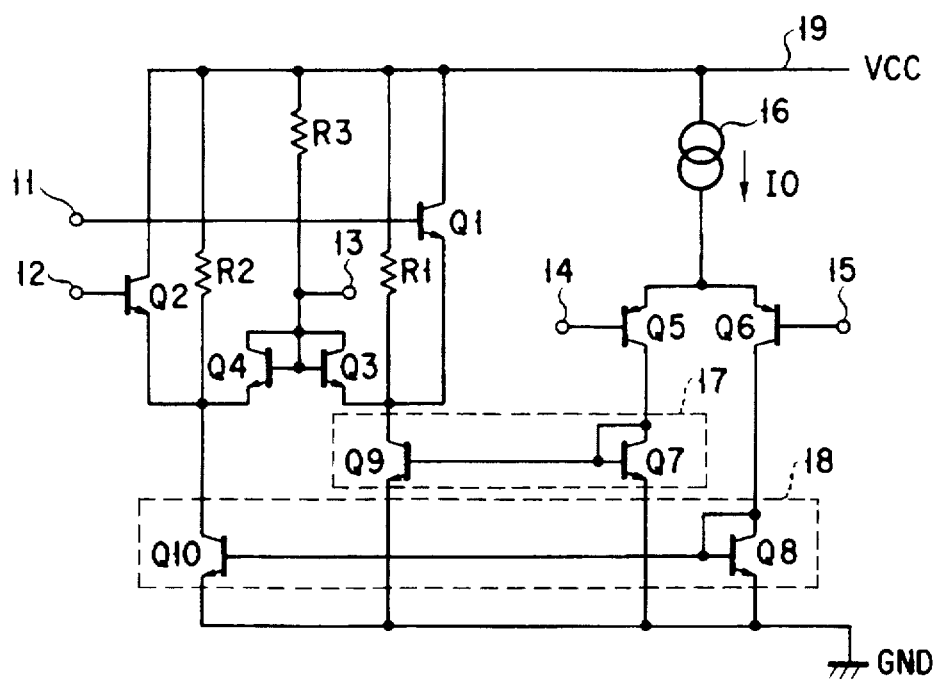
FIG. 4 is a circuit diagram showing an example of a conventional input switch circuit.

An embodiment of the present invention will now be described with reference to accompanying drawings.

FIG. 1 shows a brief structure of the present invention. As can be seen in the figure, an input switch circuit 10 for switching, for example, two input signals, includes an first signal input node to which a first input signal is supplied, and a second signal input node 12 to which a second input signal is supplied. The first input signal is, for example, an ordinary video signal, and the second input signal is, for example, a video signal which corresponds to data such as characters displayed on the display. The input switch circuit 10 further includes a first switch control signal input node 14 to which a first switch control signal is supplied, a second switch control signal input node 15 to which a second switch control signal is supplied, and an output node 13. The first and second switch control signal input nodes 14 and 15 are connected to, for example, a microprocessor 21. The microprocessor 21 generates the first and second switch control signal in accordance with the timing for switching between the first and second input signals. Further, a display device 22 is connected the output node 13.

FIG. 2 shows an example of the input switch circuit 10.

In FIG. 2, a first transistor Q1 of an NPN type functions as an input buffer. A base of the transistor Q1 is connected to the first signal input node 11. A second transistor Q2 of an NPN type functions as an input buffer. A base of the transistor Q2 is connected to the second signal input node 12, and a collector of the transistor Q2 is connected to a collector of the first transistor Q1.

An emitter of a third transistor Q3 of an NPN type is connected to the emitter of the first transistor Q1, and a base and a collector of this transistor Q3 are connected to each other, and are further connected to the output node 13. An emitter of a fourth transistor Q4 of the NPN type is connected to an emitter of the second transistor Q2, and a base and a collector of this transistor Q4 are connected to each other, and are further connected to the output node 13.

A first resistance element R1 is connected between the common emitter of the first and third transistors Q1 and Q3 and a power node 19, and a second resistance element R2 is connected between the common emitter of the second and fourth transistors Q2 and Q4 and the power node 19.

Emitters of PNP-type fifth and sixth transistors Q5 and Q6 which constitute a differential amplifier are connected commonly to each other. Between the common emitter and the power node, a constant current source 16 is connected. Bases of the transistors Q5 and Q6 are connected to a first switch control signal input node 14 and a second switch control signal input node 15, respectively.

A collector and a base of an NPN-type seventh transistor Q7 is connected between the collector of the fifth transistor Q5 and an emitter of this transistor Q7 is grounded. A collector and a base of an NPN-type eighth transistor Q8 is connected to the collector of the sixth transistor Q6 and an emitter of this eighth transistor Q8 is grounded.

A base of an NPN-type ninth transistor Q9 is connected to the base and emitter of the seventh transistor Q7, and a collector of the ninth transistor Q9 is connected to the common emitter of the first and third transistors Q1 and Q3. An emitter of the ninth transistor Q9 is grounded. The seventh transistor Q7 and the ninth transistor Q9 constitute a first current mirror circuit 17.

A base of an NPN-type tenth transistor Q10 is connected to the base and emitter of the eighth transistor Q8, and a collector of the tenth transistor Q10 is connected to the common emitter of the second and fourth transistors Q2 and Q4. An emitter of the tenth transistor Q10 is grounded. The eighth transistor Q8 and the tenth transistor Q10 constitute a second current mirror circuit 18.

Further, a third current mirror 20 serves to set a current flowing between the power node 19 and the output node 13, equal to a current flowing between the power node 19 and the common collector of the first and second transistors Q1 and Q2.

The third current mirror circuit 20 consists of a PNP-type eleventh transistor Q11 serving as an input-side transistor and a PNP-type twelfth transistor Q12 serving as an output-side transistor. An emitter of the eleventh transistor Q11 is connected to the power node 19, and a base and a collector thereof are connected to the common collector of the first and second transistors Q1 and Q2. An emitter of the twelfth transistor Q12 is connected to the power node 19, and a base thereof is connected to the base and collector of the eleventh transistor Q11. A collector of this transistor Q12 is connected to the output node 13.

In the above-described structure, the case where a potential of the first switch control signal SW1, applied to the first switch control signal input node 14 is lower than a potential of the second switch control signal SW2, applied to the second switch control signal input node 15, is called a first selection mode, and the reverse case where the potential of the second switch control signal SW2 is lower than the potential of the first switch control signal SW1, is called a second selection mode.

First, the operation of the first selection mode will now be described. In this mode, the fifth transistor Q5 is turned on, and the sixth transistor Q6 is turned off. Therefore, each of the seventh transistor Q7 and the ninth transistor Q9 of the first current mirror circuit 17 is turned on, and each of the first transistor Q1 and the third transistor Q3 is turned on. In this manner, a first video input signal supplied to the base of the first transistor Q1 is output from the base-collector of the third transistor Q3, that is, the output node 13.

At this point, each of the eighth transistor Q8 and the tenth transistor Q10 which constitute the second current mirror circuit 18 is turned off, the potential of the emitter commonly connected to the second transistor Q2 and the fourth transistor Q4 is pulled up to the power voltage VCC via the second resistance element R2. Therefore, both of the second transistor Q2 and the fourth transistor Q4 are turned off.

On the other hand, in the case of the second selection mode, the sixth transistor Q6 is turned on, and the fifth transistor Q5 is turned off. Therefore, each of the eighth transistor Q8 and the tenth transistor Q10 of the second current mirror circuit 18, is turned on, and each of the second transistor Q2 and the fourth transistor Q4 is turned on. In this manner, a second video input signal supplied to the base of the second transistor Q2 is output from the base-collector of the fourth transistor Q4, that is, the output node 13.

At this point, each of the seventh transistor Q7 and the ninth transistor Q9 of the first current mirror circuit 17 is turned off, the potential of the emitter commonly connected to the first transistor Q1 and the third transistor Q3 is pulled up to the power voltage VCC via the first resistance element R1. Therefore, both of the first transistor Q1 and the third transistor Q3 are turned off.

With the circuit having the above-described structure, in the first and second operation modes, a constant current IO from the constant current source 16 flows to one of the two current mirror circuits 17 and 18, and one of the third transistor Q3 and the fourth transistor Q4, connected to the output node 13, is in an ON state.

For example, in the second selection mode, when both of the transistors Q2 and Q4 are in the ON state, and both of the transistors Q1 and Q3 are in the OFF state, an emitter current IEQ2 of the transistor Q2 is allowed to flow as an emitter current IEQ4 of the transistor Q4 by the third current mirror circuit 20. Thus, the emitter current IEQ2 of the transistor Q2 and the emitter current IEQ4 of the transistor Q4 are equalized with each other. Consequently, the base-emitter voltage VFQ2 of the transistor Q2 is canceled out by the base-emitter voltage VFQ4 of the transistor Q4.

In other words, where an input signal voltage is expressed by Vin, the output signal voltage Vout becomes equal to Vin as expressed in the equation (6) bellow:

$$Vout = Vin - VFQ2 + VFQ4 = Vin \tag{6}$$

On the other hand, in reverse, in the first selection mode, when both of the transistors Q1 and Q3 are in the ON state, and both of the transistors Q2 and Q4 are in the OFF state, an emitter current IEQ1 of the transistor Q1 is allowed to flow as an emitter current IEQ3 of the transistor Q3 by the second current mirror circuit 18. Thus, the emitter current IEQ1 of the transistor Q1 and the emitter current IEQ3 of the transistor Q3 are equalized with each other. Consequently, the base-emitter voltage VFQ1 of the transistor Q1 is canceled out by the base-emitter voltage VFQ3 of the transistor Q3, thus equalizing Vout and Vin with each other.

According to the embodiment described above, the base-emitter voltages of the transistors Q1 and Q3 or the base-emitter voltages of the transistors Q2 and Q4 can be canceled out with each other when switching two input signals over. In this manner, a voltage equal to a switched input signal voltage can be output.

FIG. 3 illustrates an operation in the case where first and second video input signals VD1 and VD2 are switched over by first and second switch control signals SW1 and SW2. At the time of the switching, the levels of the first and second video input signals VD1 and VD2 differ from each other. According to the embodiment, in the case where the first video input signal VD1 is switched over to the second video input signal VD2 in the middle of the horizontal scanning period of an image displayed, the DC level does not vary at the switching point. Consequently, as is clear from this figure, noise such as indicated as broken lines is not created in the output signal Vout, and therefore the deterioration of the image can be prevented.

The above-described embodiment was described in connection with the case of a television device. However, the usage of the present invention is not limited to the television device, but the present invention is applicable to the cases where display images are switched over in other display devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An input switch circuit comprising:

a first transistor of a first polarity type, having a base to which a first input signal is supplied;

a second transistor of a first polarity type, having a base to which a second input signal is supplied, and a collector connected to a collector of said first transistor;

a third transistor of a first polarity type, having an emitter connected to an emitter of said first transistor, and a base and a collector both connected to an output node;

a fourth transistor of a first polarity type, having an emitter connected to an emitter of said second transistor, and a base and a collector both connected to said output node;

a first resistance element connected between a common emitter connected to said first and third transistors, and a first power node;

a second resistance element connected between a common emitter connected to said second and fourth transistors, and said first power node;

a first constant current source transistor connected between the common emitter connected to said first and third transistors, and a second power node;

a second constant current source transistor connected between the common emitter connected to said second and fourth transistors, and said second power node, one of said first and second constant current source transistors being turned on in accordance with first and second switch control signal; and a current mirror circuit having an input end connected to said first power node and said collectors of said first and second transistors and an output end connected to said first power node and said output node, said current mirror circuit used to set a current flowing into said emitter of said first transistor equal to a current flowing into said emitter of said third transistor, and a current flowing into said emitter of said second transistor equal to a current flowing into said emitter of said fourth transistor.

2. A circuit according to claim 1, wherein said current mirror circuit includes:

an input-side transistor of a second polarity type, having an emitter connected to said first power node, and having a collector and a base connected to said first and second transistors; and an output-side transistor of a second polarity type, having an emitter connected to said first power node, a collector connected to said signal output node, and a base connected to the base of said input-side transistor.

3. A circuit according to claim 1, further comprising:

fifth and sixth transistors of a second polarity type, which constitute a differential amplifier, and have emitters commonly connected to each other, said fifth transistor having a base to which said first switch control signal is supplied, and said sixth transistor having a base to which said second switch control signal is supplied;

a constant current source connected between said first power node and the commonly connected emitters of said fifth and sixth transistors;

a seventh transistor of the first polarity type, having a collector and a base connected to the collector of said fifth transistor, an emitter connected to said second power node, a base connected to the base of said first constant current transistor; and an eighth transistor of the first polarity type, having a collector and a base connected to the collector of said sixth transistor, an emitter connected to said second power node, a base connected to the base of said second constant current transistor.

4. A circuit according to claim 1, wherein said first input signal is a video signal, and said second input signal is a video signal corresponding to character data.

5. A circuit according to claim 1, further comprising:

a signal generating circuit for generating said first and second switch control signals, said signal generating circuit generating said first and second switch control signals in accordance with a timing for switching said first and second input signals over.

6. An input switch circuit comprising:

a first transistor of a first polarity type, having a base to which a first input signal is supplied;

a second transistor of a first polarity type, having a base to which a second input signal is supplied, and a collector connected to a collector of said first transistor;

a third transistor of a first polarity type, having an emitter connected to an emitter of said first transistor, and a base and a collector both connected to an output node;

a fourth transistor of a first polarity type, having an emitter connected to an emitter of said second transistor, and a base and a collector both connected to said output node;

a first resistance element connected between a common emitter connected to said first and third transistors, and a first power node;

a second resistance element connected between a common emitter connected to said second and fourth transistors, and said first power node;

a constant current source having one end connected to said first power node;

a first switch element having a current path one end of which is connected to another end of said constant current source, said first switch element being controlled by a first switch control signal;

a second switch element having a current path one end of which is connected to another end of said constant current source, said second switch element being controlled by a second switch control signal, which is complementary to said first switch control signal;

a first current mirror circuit having an input end connected to said first switch element and said second power node and an output end connected to the common emitter of said first and third transistors and said second power node, said first current mirror circuit serving to supply a current flowing in said constant current source to the common emitter of said first and third transistors when said first switch element is in an ON state;

a second current mirror circuit having an input end connected to said second switch element and said second power node and an output end connected to the common emitter of said second and fourth transistors and said second power node, said first current mirror circuit serving to supply the current flowing in said constant current source to the common emitter of said second and fourth transistors when said second switch element is in an ON state; and a third current mirror circuit having an output end connected to said first power node and said output node, and an input end connected to said first power node and the common emitter of said first and second transistors, said first current mirror circuit serving to set a current flowing in said output node, equal to a current flowing between said first power node and the common collector of said first and second transistors.

7. A circuit according to claim 6, wherein said first switch element comprises a fifth transistor of a second polarity type, and said second switch element comprises a sixth transistor of the second polarity type.

8. A circuit according to claim 7, wherein said first current mirror circuit comprises:

a seventh transistor of the first polarity type, having a collector and a base connected to the collector of said fifth transistor, an emitter connected to said second power node; and a eighth transistor having a collector connected to the commonly connected emitter of said first and third transistors, an emitter connected to said second power node, a base connected to the base of said seventh transistor.

9. A circuit according to claim 7, wherein said second current mirror circuit comprises:

an ninth transistor of the first polarity type, having a collector and a base connected to the collector of said sixth transistor, an emitter connected to said second power node; and a tenth transistor having a collector connected to the commonly connected emitter of said second and fourth transistors, an emitter connected to said second power node, a base connected to the base of said eighth transistor.

10. A circuit according to claim 6, wherein said third current mirror circuit comprises:

an input-side transistor of the second polarity type, having an emitter connected to said first power node and a collector and a base connected to the commonly connected collectors of said first and second transistors; and an output-side transistor having an emitter connected to said first power node, a collector connected to said signal output node, and a base connected to the base of said input-side transistor.

11. A circuit according to claim 6, wherein said first input signal is a video signal, and said second input signal is a video signal corresponding to character data.

12. A circuit according to claim 6, further comprising:

a signal generating circuit for generating said first and second switch control signals, said signal generating circuit generating said first and second switch control signals in accordance with a timing for switching said first and second input signals over.

13. An image display device comprising:

an input signal switch circuit having first and second signal input nodes to which first and second input signals are input, respectively, first and second switch control signal input nodes to which first and second switch control signals complimentary to each other are supplied, respectively, and an output node, said input signal switch circuit outputting one of said first and second input signals in accordance with said first and second switch control signal, from said output node;

a signal generating circuit connected to said first and second switch control signal input nodes, said signal generating circuit generating said first and second switch control signal in accordance with a timing of inputting said first and second input signals;

a display device connected to said output node, said display device displaying a signal output from said output node;

said input signal switching circuit comprising:

a first transistor of a first polarity type, having a base to which a first input signal is supplied;

a second transistor of a first polarity type, having a base to which a second input signal is supplied, and a collector connected to a collector of said first transistor;

a third transistor of a first polarity type, having an emitter connected to an emitter of said first transistor, and a base and a collector both connected to an output node;

a fourth transistor of a first polarity type, having an emitter connected to an emitter of said second transistor, and a base and a collector both connected to said output node;

a first resistance element connected between a common emitter connected to said first and third transistors, and a first power node;

a second resistance element connected between a common emitter connected to said second and fourth transistors, and said first power node;

a constant current source having one end connected to said first power node;

a first switch element having a current path one end of which is connected to another end of said constant current source, said first switch element being controlled by a first switch control signal;

a second switch element having a current path one end of which is connected to another end of said constant current source, said second switch element being controlled by a second switch control signal, which is complementary to said first switch control signal;

a first current mirror circuit having an input end connected to said first switch element and said second power node and an output end connected to the common emitter of said first and third transistors and said second power node, said first current mirror circuit serving to supply a current flowing in said constant current source to the common emitter of said first and third transistors when said first switch element is in an ON state;

a second current mirror circuit having an input end connected to said second switch element and said second power node and an output end connected to the common emitter of said second and fourth transistors and said second power node, said first current mirror circuit serving to supply the current flowing in said constant current source to the common emitter of said second and fourth transistors when said second switch element is in an ON state; and a third current mirror circuit having an output end connected to said first power node and said output node, and an input end connected to said first power node and the common emitter of the first and second transistors, said first current mirror circuit serving to set a current flowing in said output node, equal to a current flowing between said first power node and the common collector of said first and second transistors.

14. A circuit according to claim 13, wherein said first switch element comprises a fifth transistor of a second polarity type, and said second switch element comprises a sixth transistor of the second polarity type.

15. A circuit according to claim 14, wherein said first current mirror circuit comprises:

a seventh transistor of the first polarity type, having a collector and a base connected to the collector of said fifth transistor, an emitter connected to said second power node; and a eighth transistor having a collector connected to the commonly connected emitter of said first and third transistors, an emitter connected to said second power node, a base connected to the base of said seventh transistor.

16. A circuit according to claim 14, wherein said second current mirror circuit comprises:

an ninth transistor of the first polarity type, having a collector and a base connected to the collector of said sixth transistor, an emitter connected to said second power node; and a tenth transistor having a collector-connected to the commonly connected emitter of said second and fourth transistors, an emitter connected to said second power node, a base connected to the base of said eighth transistor.

17. A circuit according to claim 13, wherein said third current mirror circuit comprises:

an input-side transistor of the second polarity type, having an emitter connected to said first power node and a collector and a base connected to the commonly connected collectors of said first and second transistors; and an output-side transistor having an emitter connected to said first power node 19, a collector connected to said signal output node, and a base connected to the base of said input-side transistor.

18. A circuit according to claim 13, wherein said first input signal is a video signal, and said second input signal is a video signal corresponding to character data.

* * * * *